(12) United States Patent
Shu

(10) Patent No.: US 9,176,400 B2
(45) Date of Patent: Nov. 3, 2015

(54) SYSTEM AND METHOD FOR REDUCING CONTAMINATION IN EXTREME ULTRAVIOLET LITHOGRAPHY LIGHT SOURCE

(71) Applicant: Semiconductor Manufacturing International (Shanghai) Corporation, Shanghai (CN)

(72) Inventor: Emily Shu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/267,193

(22) Filed: May 1, 2014

(65) Prior Publication Data
US 2015/0034844 A1 Feb. 5, 2015

(30) Foreign Application Priority Data
Jul. 24, 2013 (CN) .......................... 2013 1 0315161

(51) Int. Cl.
*H05G 2/00* (2006.01)
*G03F 7/20* (2006.01)

(52) U.S. Cl.
CPC ........ *G03F 7/70916* (2013.01); *G03F 7/70033* (2013.01); *H05G 2/005* (2013.01); *H05G 2/008* (2013.01); *H05G 2/003* (2013.01)

(58) Field of Classification Search
CPC ............ G03F 7/70916; G03F 7/70033; G03F 7/70175; G03F 7/70025; G03F 7/70041; G02B 27/0006; G02B 19/0095; G02B 26/0816; G02B 5/0891; G01N 2223/204; H05G 2/005; H05G 2/003; H05G 2/008
See application file for complete search history.

(56) References Cited

U.S. PATENT DOCUMENTS

| | | | | |
|---|---|---|---|---|
| 7,732,793 B2 * | 6/2010 | Ershov et al. | ............ | 250/504 R |
| 2002/0080834 A1 * | 6/2002 | Kusunose | ........................ | 372/25 |
| 2006/0131515 A1 * | 6/2006 | Partlo et al. | ............... | 250/504 R |
| 2008/0043321 A1 * | 2/2008 | Bowering et al. | ............. | 359/359 |
| 2008/0230726 A1 * | 9/2008 | Shirai et al. | ............... | 250/504 R |
| 2010/0192973 A1 * | 8/2010 | Ueno et al. | ..................... | 134/1.1 |
| 2010/0321660 A1 * | 12/2010 | Peng et al. | ....................... | 355/67 |
| 2012/0025109 A1 * | 2/2012 | Abhari et al. | ............. | 250/504 R |
| 2014/0306115 A1 * | 10/2014 | Kuritsyn et al. | ........... | 250/358.1 |

* cited by examiner

*Primary Examiner* — Michael Logie
(74) *Attorney, Agent, or Firm* — Anova Law Group, PLLC

(57) ABSTRACT

Various embodiments provide systems and methods for extreme ultraviolet (EUV) lithography light source. An exemplary system can include a laser radiation apparatus configured to provide laser radiation. The system can further include an EUV light excitation source material configured to receive the laser radiation to generate an EUV light. The laser radiation can generate droplets from the EUV light excitation source material. The system can further include a collector configured to collect the EUV light. The collector can include a plurality of reflective mirrors surrounding the EUV light excitation source material. The plurality of reflective mirrors can be movable. The collector can further include a mirror control system synchronized with the laser radiation apparatus and configured to set the plurality of reflective mirrors to be in one of a reflective state for reflecting the EUV light and a non-reflective state for preventing contamination by the droplets.

15 Claims, 8 Drawing Sheets

SYSTEM AND METHOD FOR REDUCING CONTAMINATION IN EXTREME ULTRAVIOLET LITHOGRAPHY LIGHT SOURCE

CROSS-REFERENCES TO RELATED APPLICATIONS

This application claims priority to Chinese Patent Application No. CN201310315161.5, filed on Jul. 24, 2013, the entire contents of which are incorporated herein by reference.

FIELD OF THE DISCLOSURE

The present disclosure relates to the field of semiconductor fabrication and, more particularly, relates to systems and methods for extreme ultraviolet (EUV) lithography exposure.

BACKGROUND

Lithography is a process of transferring desired patterns onto a substrate (typically a target area of the substrate) such that patterns are created in different device regions or current regions. Specifically, using exposure in a lithography process, a pattern can be created onto a photoresist layer (made of a photo-sensitive polymer material) disposed on the surface of the substrate to achieve pattern transfer.

With rapid development of semiconductor process technologies, feature sizes of patterns to be exposed by the lithography process have become smaller and smaller, which requires an increasingly higher resolution of lithography. The lithography resolution, or the minimum feature size of lithography is given based on the Rayleigh's criterion, as shown in equation (1):

$$CD = \kappa_1 \times \lambda / NA \qquad (1)$$

wherein $\lambda$ is the exposure wavelength of the lithography process. NA is the numerical aperture of the projection system of lithographic equipment. $\kappa_1$ is a lithography process-related factor. CD is the minimum feature size (or critical dimension) of the printed pattern. According to the above equation (1), CD can be reduced by three methods, i.e., reducing the exposure wavelength, increasing the numerical aperture, or decreasing the $\kappa_1$ factor.

EUV lithography has been considered the most promising lithographic technology. EUV lithography radiation is an electromagnetic radiation having a wavelength ranging from 5 nm to 20 nm and currently is generated by, either laser-produced plasma (LPP), or discharge-produced plasma (DPP).

EUV lithography light source system for generating EUV light usually includes a source-excitation module for generating an EUV-light-producing plasma from a vaporized source material, and a collector module for collecting and collimating the appropriate EUV light generated from the EUV light source-excitation module into an optical non-telecentric system. In a laser-produced plasma system, the source-excitation module usually applies high-energy laser beams to the source material which then produces plasma in the excitation source. In a discharge produced plasma system, high voltage produces plasma which generates EUV light in the excitation source. The collector module has a number of optical elements to direct, select, and collimate the EUV light at a desired wavelength into an output EUV beam.

However, when a conventional EUV light source system excites the solid source material into vapor which then forms EUV-producing plasma, the source material vapor droplets may condense on the EUV light-collecting optical elements. As a result, these condensed droplets can contaminate EUV light reflecting optics in the source system. In addition, the downstream EUV-collecting optics can get contaminated by the flying-over droplets. Once contaminated, light-collecting efficiency goes down quickly. The disclosed methods and systems are directed to solve one or more problems set forth above and other problems.

BRIEF SUMMARY OF THE DISCLOSURE

One aspect of the present disclosure includes a system for preventing light source contamination in extreme ultraviolet (EUV) lithography system. The system can include a laser radiation apparatus configured to provide pulsed laser radiation. The system can further include an EUV light excitation source material configured to receive the laser radiation and generate an EUV-light-producing plasma. The plasma can emit EUV photons. The laser radiation can generate droplets from the EUV light excitation source material. The system can further include a collector configured to collect the EUV light. The collector can include a plurality of reflective mirrors surrounding the EUV light excitation source material. The plurality of reflective mirrors can be movable. The collector can further include a mirror control system synchronized with the laser radiation apparatus with a predetermined delay time. The collector is configured to set the plurality of reflective mirrors to be in a reflective state for reflecting the EUV light and a non-reflective state for preventing contamination by the droplets.

Another aspect of the present disclosure includes a system for EUV lithography light source. The system can include a pulsed high-voltage-discharge apparatus configured to apply a high-voltage discharge. The system can further include an EUV light excitation source material configured to receive the high-voltage discharge to generate an EUV-light-producing plasma. The high-voltage discharge can generate droplets from the EUV light excitation source material. The system can further include a collector configured to collect the EUV light from the source material. The collector can include a plurality of reflective mirrors surrounding the EUV light excitation source material. The plurality of reflective mirrors can be movable. The collector can further include a mirror control system synchronized with the high-voltage-discharge apparatus and configured to set the plurality of reflective mirrors to be in one of a reflective state for reflecting the EUV light and a non-reflective state for preventing contamination by the droplets.

Another aspect of the present disclosure includes a method for EUV lithography light source decontamination. The system for EUV lithography light source decontamination can include a plurality of reflective mirrors and a mirror control system. The method can include generating an EUV-light-producing plasma by exciting an EUV light excitation source material, wherein the EUV light excitation source material has droplets condensing on the reflective mirrors. When the EUV light excitation source material is excited to generate the EUV light, the mirror control system can configure the plurality of reflective mirrors to be in a reflective state for reflecting the EUV light. After the EUV light excitation source material stops generating the EUV light, and before the droplets reach the reflective mirrors, the mirror control system can configure the plurality of reflective mirrors to be in a non-reflective state for preventing contamination by the droplets.

Other aspects or embodiments of the present disclosure can be understood by those skilled in the art in light of the description, the claims, and the drawings of the present disclosure.

DETAILED DESCRIPTION

Figure 1:
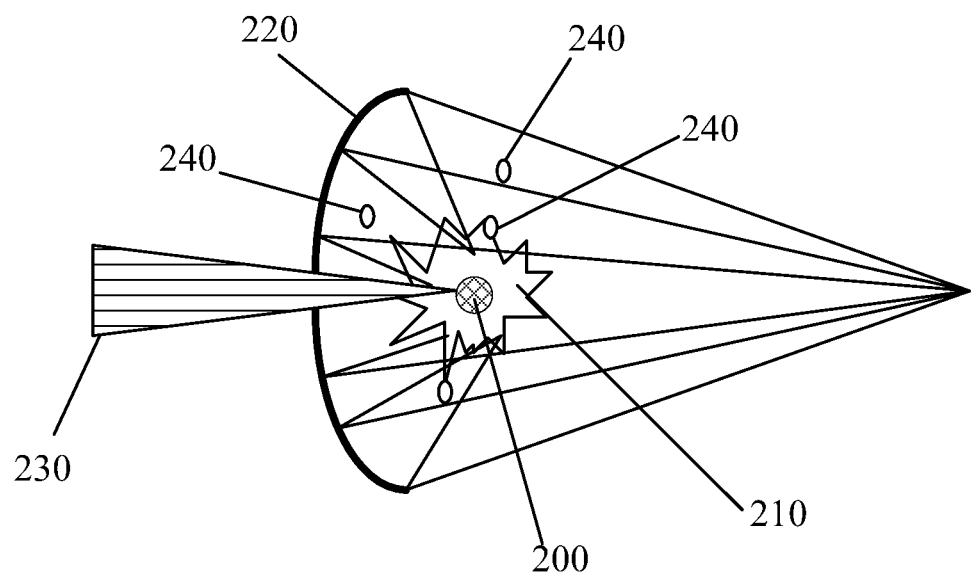
FIG. 1 depicts a system for EUV lithography light source that applies a high-energy laser beam to an EUV light excitation source material to generate an EUV light.

Reference will now be made in detail to exemplary embodiments of the disclosure, which are illustrated in the accompanying drawings. Wherever possible, the same reference numbers will be used throughout the drawings to refer to the same or like parts.

An EUV light can be generated by a plasma from a number of source materials. A light source system for generating an EUV light can usually include a source-excitation module for exciting a source material to provide an EUV-light-producing plasma, and a collector module for collecting EUV light at desired wavelength. In various embodiments, collecting of the EUV light can refer to any appropriate functions including directing, collimating the EUV light, without limitation.

The source-excitation module can apply a high-energy laser beam to the EUV light excitation source material, or apply a high-voltage to the EUV light excitation source material (i.e., charge the EUV light excitation source material at a high voltage), such that a plasma can be generated, and the plasma can radiate an EUV light. The collector module can include a reflective-mirror-type normal incidence radiation collector, or a collector, used for receiving the EUV light and collimating the EUV light into a beam.

The EUV light excitation source material can typically include metal (e.g. tin, lithium) particle(s), a gas (e.g., xenon), and/or a vapor stream (e.g., Li vapor). When the EUV light excitation source material is excited, the excitation of the EUV light excitation source material usually is incomplete. After a vaporization phase, droplets condense from the EUV light excitation source material. The droplets can be incident on a reflecting surface of the collector (or a collector surface) in an EUV exposure machine, and thus can reduce reflectivity of the collector surface or adhere to the collector surface to cause contamination.

According to the present disclosure, there can be a time delay between excitation of an EUV light excitation source material and contamination of the collector surface by droplets. Because speed of light is about $10^8$ m/s, while the droplets can have a speed (or velocity) ranging from about 1 m/sec to about 5 m/sec, the speed of the droplets can be much lower than the speed of light. In addition, there can be a preset distance between the EUV light excitation source material and the collector. When an EUV light reaches the collector surface, the droplets have yet not arrived at the collect surface therefore have not contaminated the collector yet. That is, the droplets can reach the collector after a certain time length from laser radiation.

Therefore, various embodiments provide a system for EUV lithography light source. The system can have movable reflective mirror(s) in a collector, and can effectively reflect EUV light and reduce risk of contamination of droplets. For example, a reflective mirror can be configured to change between a reflective state and a non-reflective state. When an EUV light excitation source material is excited, the reflective mirror can be configured to be in the reflective state. The reflective state can be suitable for reflecting an EUV light. After the EUV light excitation source material is excited, the reflective mirror can be configured to be in the non-reflective state. The non-reflective state can be suitable for avoiding the droplet contamination. Thus contamination of the collector can be prevented.

As used herein, unless otherwise specified, a light source system for EUV lithography is a light source system for an EUV lithography machine, and can be referred to as an EUV light source system or a system for EUV lithography light source.

For example, when the reflective mirror(s) are configured to be in the reflective state, the reflective mirrors can be configured to direct an EUV light. When the reflective mirror (s) are configured to be in the non-reflective state, a reflective surface of each reflective mirror can be rotated to be substantially parallel to a flight direction of the droplets. For example, a reflective mirror (or the reflective surface of a reflective mirror) can be rotated to be substantially parallel to the corresponding flight direction of the droplets. Thus, probability of the droplets fall onto the reflective surface of the each reflective mirror can be reduced, and risk of contamination of the reflective mirrors can be reduced.

In various embodiments, a reflective mirror parallel to the 'corresponding flight direction of droplets' can refer to a reflective mirror parallel to the flight direction of the droplets flying near or close to the reflective mirror.

The reflective mirror can be made of a material including molybdenum, molybdenum alloy, silicon, ruthenium, and/or ruthenium alloy. Alternatively, the reflective mirror can have a silicon substrate and the silicon substrate can have a surface coated (e.g., plated) with a multi-layer structure including, e.g., silicon molybdenum film(s), molybdenum alloy, ruthenium and/or ruthenium alloy film(s).

The reflective mirror can be movable and can be rotated along a predetermined axis. The predetermined axis can be a central axis of the reflective mirror, a center line of the EUV light excitation source material, or any straight line located in the EUV light source system. The predetermined axis can be selected based on the consideration that the reflective mirror can be contaminated less by the droplets when rotating along the predetermined axis. The predetermined axis can be selected according to the actual EUV light source system, and is not limited in the present disclosure.

The reflective mirror can be movable by providing additional control apparatus including, e.g., using electric control, magnetic control, and/or mechanical control to control the movable reflective mirror.

FIG. 1 depicts a system for EUV lithography light source that applies a high-energy laser beam to an EUV light excitation source material to generate an EUV light. For example, a process of applying a high-energy laser beam to an EUV light excitation source material to generate an EUV light (i.e., a laser-plasma mode) can include radiating a laser beam at the EUV light excitation source material to generate a plasma. The plasma can thus radiate an EUV light.

Referring to FIG. 1, in one embodiment, a system for EUV lithography light source can include a EUV light excitation source material 200. The EUV light excitation source material can include Xe, Sn, and/or Li. The system for EUV lithography light source can further include a laser radiation apparatus 230. The laser radiation apparatus 230 can be configured to provide laser radiation. The laser radiation can be used for heating the EUV light excitation source material 200 to generate a plasma 210. The laser radiation apparatus 230 can include a $CO_2$ laser (i.e., a laser apparatus) to excite or activate a laser have a wavelength of about 10.6 microns. The plasma can radiate an EUV light. The system for EUV lithography light source can further include a collector 220 provided at a periphery of the EUV light excitation source material 200. The collector 220 can be configured to focus the EUV light.

As previously described, the vaporization of the EUV light excitation source material usually is incomplete, resulting in large amount of droplets condensing on the reflective mirror surface. Even if the vaporization is complete, condensation of droplets on cool surfaces is often unavoidable. After the EUV light excitation source material is excited, droplets 240 can be produced. The droplets 240 can be incident on a surface of the collector 220 or surface of other optical devices in the EUV source area, and thus can reduce reflectivity of the surface of the collector 220 or adhere to the surface of the collector 220 to cause contamination.

There can be a time delay between emission of the EUV light excitation source material 200 and contamination of the surface of the collector 220 by the droplets 240 from their time of flight. Because speed of light is about $10^8$ m/s, while the droplets 240 can have a speed ranging from about 1 m/sec to about 5 m/sec, the speed of the droplets 240 can be much lower than the speed of light. In addition, there can be a preset distance between the EUV light excitation source material 200 and the collector 220. When an EUV light reaches the surface of the collector 220, the droplets 240 have yet not contaminated the collector 220. That is, the droplets 240 can reach the collector 220 after a delay time T from starting of the laser radiation.

Figure 2A:
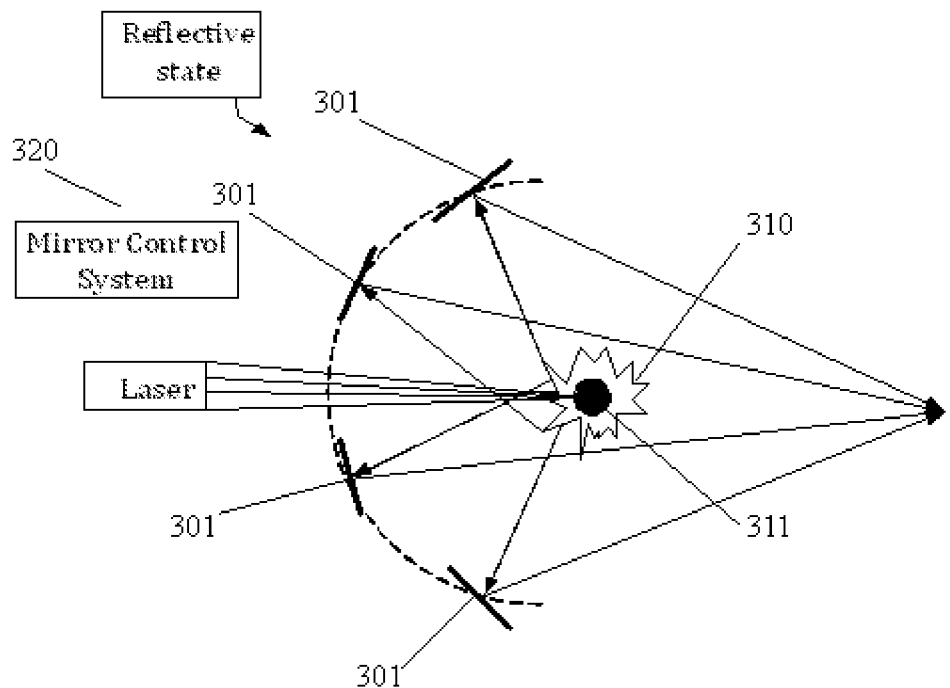
FIG. 2A depicts a structure diagram of an exemplary system for EUV lithography light source in a reflective state in accordance with various disclosed embodiments.
Figure 2B:
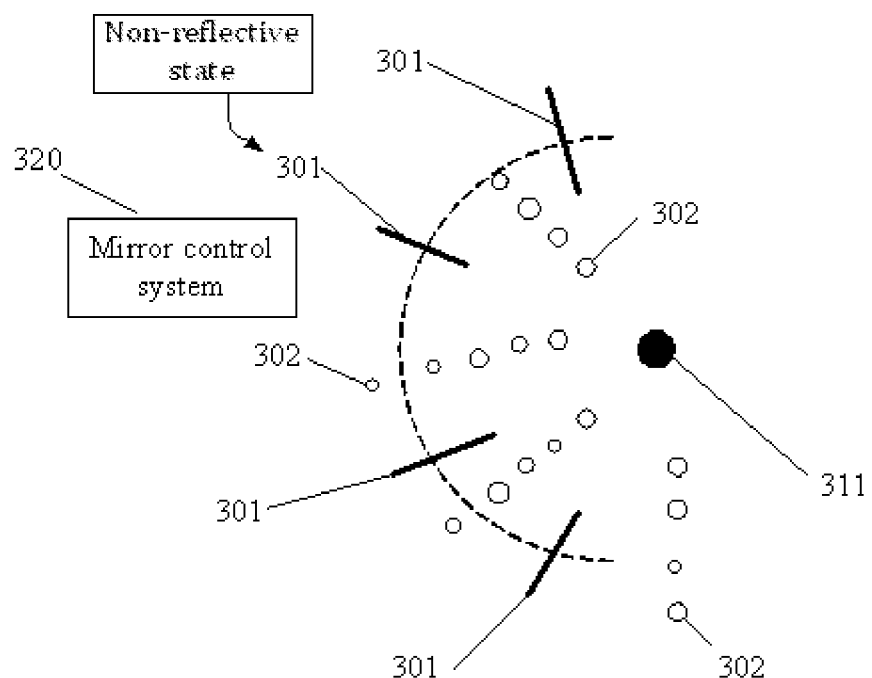
FIG. 2B depicts a structure diagram of an exemplary system for EUV lithography light source in a non-reflective state in accordance with various disclosed embodiments.

The various disclosed embodiments provide a system for EUV lithography light source. FIG. 2A depicts a structure diagram of an exemplary system for EUV lithography light source in a reflective state in accordance with various disclosed embodiments. FIG. 2B depicts a structure diagram of an exemplary system for EUV lithography light source in a non-reflective state in accordance with various disclosed embodiments.

The system for EUV lithography light source can have a collector for accommodating EUV light. The collector can include a plurality of reflective mirrors 301. The reflective mirrors 301 can be movable under the control of a mirror control system 320 synchronized with an EUV generation apparatus, e.g., a laser radiation apparatus. The reflective mirrors 301 can be configured to be in a reflective state or in a non-reflective state. The reflective state can be suitable for reflecting an EUV light. The non-reflective state can be suitable for avoiding contamination by droplets 302. That is, during a laser radiation, the reflective mirrors 301 can be configured to be in the reflective state, to reflect an EUV light. After the laser radiation, the reflective mirrors 301 can be configured to be in the non-reflective state. Because the droplets 302 can reach the collector after a delay time T after the laser radiation, the non-reflective state can be suitable for avoiding contamination by the droplets 302.

The delay time T is a time length that can be constrained by a pulse duration time of the incident laser beam, an incident time of the incident laser beam, a speed of the incident laser beam, a speed of the EUV light, designed size of components of the EUV light source system, type of the EUV light excitation source material, and/or size of the droplets. In various embodiments, the plurality of reflective mirrors 301 can be arranged along (i.e., around or surrounding) an EUV light excitation source material 311. The collector formed by the plurality of reflective mirrors 301 can collect and focus the EUV light to a central focal point or to a virtual source point.

In various embodiments, the number of the reflective mirrors 301 can be about 2, 3, 4 . . . 7 . . . 10 . . . , i.e., any number greater than or equal to 2. A greater number of the movable reflective mirrors 301 can result in a better effect of avoiding contamination from the droplets 302. However, a greater number of the reflective mirrors 301 can lead to increased cost, increased difficulty of controlling reflection, and reduced efficiency of the reflection. The number of the reflective mirrors 301 can be selected according to needs of actual EUV exposure, and is not limited in the present disclosure.

The reflective mirrors 301 can be made of a material including molybdenum, molybdenum alloy, silicon, ruthenium, and/or ruthenium alloy. Alternatively, the reflective mirrors 301 can have a silicon substrate and the silicon substrate can have a surface coated (e.g., plated) with a multilayer structure including, e.g., silicon molybdenum film, molybdenum alloy, ruthenium and/or ruthenium alloy film.

The system for EUV lithography light source in accordance with various embodiments can further include an EUV generation apparatus for generating an EUV light. The EUV generation apparatus can include a laser radiation apparatus and an EUV light excitation source material 311. The EUV generation apparatus can be a pulsed laser radiation apparatus to generate a plasma 310 by radiating a laser beam at the EUV light excitation source material 311. The plasma 310 can then radiate an EUV light. The EUV generation apparatus can be independent of the system for EUV lithography light source or can be provided in the system for EUV lithography light source.

FIG. 2A depicts the reflective mirrors 301 configured to be in a reflective state. For example, the laser radiation apparatus of the EUV generation apparatus can radiate a laser beam to excite the plasma 310. The laser beam can be in a pulse mode. During an incidence time of the laser beam, the laser beam can be incident on the EUV light excitation source material 311 to generate the plasma 310. The plasma 310 can then radiate an EUV light. At the same time, the plurality of reflective mirrors 301 have reflective surface(s) facing right at the EUV light, to form a reflective state, e.g., to form a curved reflective surface, to converge the EUV light to a focal point.

FIG. 2B depicts the reflective mirrors 301 configured to be in a non-reflective state. When the incidence time stops, or during a time length after the incidence, the reflective mirrors 301 can be configured to be in the non-reflective state. In one embodiment, the reflective surface(s) of the reflective mirrors 301 can be rotated to (e.g., parallel to) flight direction(s) of the droplets 302, such that contamination by the droplets 302 can be avoided.

In another embodiment, in order to better avoid the contamination by the droplets 302, the reflective mirrors 301 can be in the reflective state or the non-reflective state corresponding to the pulse mode of the incident laser beam. A time of configuring the reflective mirrors 301 to be in the non-reflective state can lag behind a pulse duration time of the incident laser beam, in order to avoid facing flight direction(s) of the droplets 302.

The exciting laser can be pulsed laser or laser clusters. It can also be continuously firing laser or laser clusters time-modulated into pulsed modes. The time of configuring the reflective mirrors 301 to be in the non-reflective state can lag behind the pulse duration time of the incident laser beam by a delay time T. That is, a starting time of the reflective mirrors 301 being in the non-reflective state can lag behind a starting time of the pulse duration time of the incident laser beam by a delay time T. The delay time T can range from about 2 milliseconds to about 12 milliseconds (e.g., about 10 milliseconds as shown by waveform D in FIG. 3). In various embodiments, 'a starting time of the reflective mirrors 301 being in the non-reflective state' can refer to a starting time from which the reflective mirrors 301 start to be in the non-reflective state.

There can be a time delay between excitation of the EUV light excitation source material 311 and contamination of the surface of the reflective mirrors 301 by the droplets 302. Because the speed of light is about $10^8$ m/s, while the droplets 302 can have a speed ranging from about 1 m/sec to about 5 m/sec, the speed of the droplets 302 can be much lower than the speed of light. In addition, there can be a preset distance between the EUV light excitation source material 311 and the collector. For example, a chamber size of the collector can range from about 10 cm to about 30 cm. According to the above data, it can take a time ranging from about 20 milliseconds to about 60 milliseconds for the droplets 302 to arrive at the reflective mirrors 301.

Figure 3:
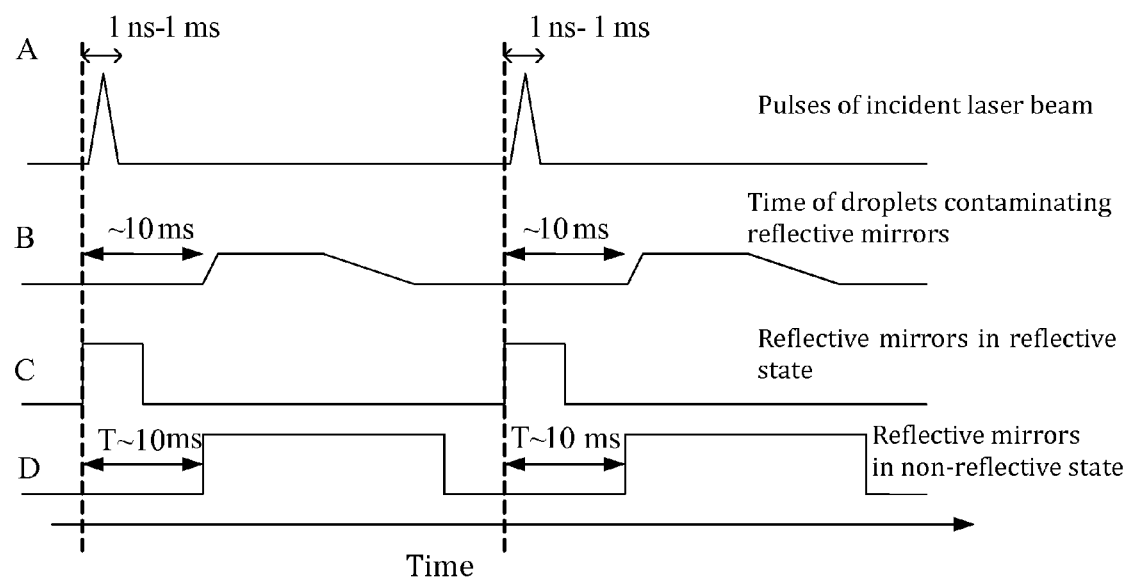
FIG. 3 depicts time sequences of pulses of an incident laser beam, contaminating droplet arrivals, a reflective mirror being in a reflective state, and a reflective mirror being in a non-reflective state, as a function of time in accordance with various disclosed embodiments.

According to the above data, FIG. 3 depicts time sequences of pulses of an incident laser beam, contaminating droplet arrivals, a reflective mirror being in a reflective state, and a reflective mirror being in a non-reflective state, as a function of time in accordance with various disclosed embodiments. Waveform A corresponds to pulses of an incident laser beam, waveform B corresponds to droplet contamination, waveform C corresponds to a reflective mirror being in a reflective state, and waveform D corresponds to a reflective mirror being in a non-reflective state.

For illustrative purposes, in this case, the incident laser beam can have a pulse duration time ranging from about 1 nanosecond to about 1 microsecond, or from about 1 nanosecond to about 1 millisecond as shown by waveform A in FIG. 3, and it can take a time of about 10 microseconds (or about 10 milliseconds) for the droplets 302 to arrive at the reflective mirrors 301.

Waveform A as shown in FIG. 3 depicts a pulse frequency of an incident laser beam. The incident laser beam can have a pulse duration time ranging from about 1 nanosecond to about 1 millisecond. Correspondingly, waveform B as shown in FIG. 3 depicts a time length when the droplets 302 can contaminate reflective mirrors 301. For example, the time length when the droplets 302 can contaminate reflective mirrors 301 can start at about 10 milliseconds from starting time of the incidence of the laser beam, i.e., can start at the time when the droplets 302 can arrive at the reflective mirrors 301.

Therefore, correspondingly, waveform C as shown in FIG. 3 depicts the reflective mirrors 301 being in the reflective state as a function of time. Because the reflective mirrors 301 need to accommodate or focus the EUV light, the time length of the reflective mirrors 301 being in the reflective state can be greater than the pulse duration time of the incident laser beam and less than the time length for the droplets 302 to start arriving at the reflective mirrors 301. The time length for the droplets 302 to start arriving at the reflective mirrors 301 can refer to a time length between a starting time of the pulse duration time of the incident laser beam and a time when the droplets 302 start to arrive at the reflective mirrors 301.

Correspondingly, waveform D as shown in FIG. 3 depicts the reflective mirrors 301 being in the non-reflective state as a function of time. The reflective mirrors 301 need to be in the non-reflective state when the droplets 302 may contaminate the reflective mirrors 301. Therefore, the time length of the reflective mirrors 301 being in the non-reflective state can be greater than the time length during which the droplets 302 can contaminate the reflective mirrors 301. Then the reflective mirrors 301 can be in the reflective state during the next pulse of the incident laser beam.

The time or the time length of the reflective mirrors 301 being in the reflective state or the non-reflective state need to be set based on parameters including a pulse duration time of the incident laser beam, an incident time of the incident laser beam, a speed of the incident laser beam, a speed of the EUV light, designed size of components of the EUV light source system, type of the EUV light excitation source material, and/or size of the droplets. In various embodiments, an additional control apparatus can be provided to control switching of the reflective mirrors 301 between the reflective state and the non-reflective state, via electric control, magnetic control, and/or mechanical control. When the laser radiation is in a pulse mode, the time of configuring the reflective mirrors 301 to be in the non-reflective state can lag behind the pulse duration time of the incident laser beam. That is, a starting time of the reflective mirrors 301 being in the non-reflective state can lag behind a starting time of the pulse duration time of the incident laser beam by a delay time T, in order to avoid facing flight direction(s) of the droplets 302.

In various embodiments, the time length of the reflective mirrors 301 being in the reflective state can be greater than the pulse duration time of the incident laser beam and less than the time length for the droplets 302 to start arriving at the reflective mirrors 301. The time length for the droplets 302 to start arriving at the reflective mirrors 301 can refer to a time length between a starting time of the pulse duration time of the incident laser beam and a time when the droplets 302 start to arrive at the reflective mirrors 301.

The time length of the reflective mirrors 301 being in the non-reflective state can be greater than the time length during which the droplets 302 can contaminate the reflective mirrors 301. Then, the reflective mirrors 301 can be in the reflective state during the next pulse of the incident laser beam.

In one embodiment, the incident laser beam can have a pulse duration time ranging from about 1 nanosecond to about 1 microsecond, or from about 1 nanosecond to about 1 millisecond. The time of configuring the reflective mirrors 301 to be in the non-reflective state can lag behind the pulse duration time of the incident laser beam by a delay time T ranging from about 2 milliseconds to about 12 milliseconds.

In various embodiments, the plurality of reflective mirrors are moved into the non-reflective state at the delay time T after a starting time of each laser pulse cycle of the laser radiation. The delay time T can be shorter than or substantially equal to a flight time of the droplets to fly from the source material to reach a surface of a reflective mirror of the plurality of reflective mirrors.

Figure 4:
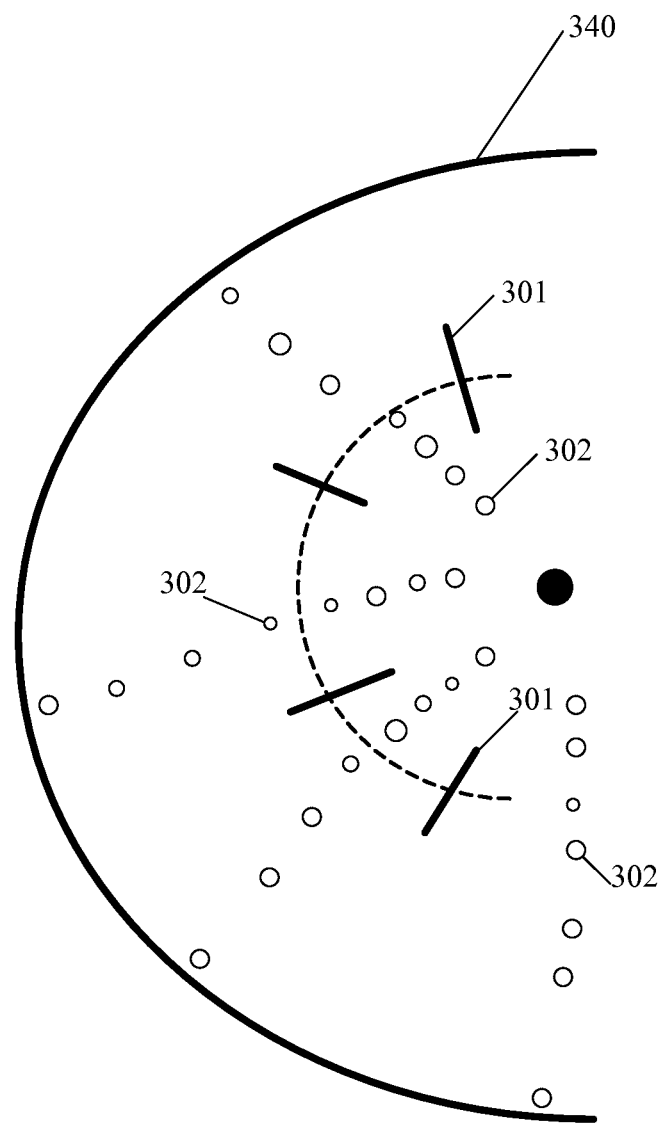
FIG. 4 depicts a structure diagram of another exemplary system for EUV lithography light source including an outer droplet stopper in accordance with various disclosed embodiments.

FIG. 4 depicts a structure diagram of another exemplary system for EUV lithography light source including an outer droplet stopper in accordance with various disclosed embodiments. Optionally, the system may further include a droplet collector 340 provided at an outer periphery of the collector. The droplet collector 340 can be configured to capture the droplets 302 that fly away from the EUV light excitation source material (e.g., the EUV light excitation source material 311 as shown in FIGS. 2A-2B), to prevent the droplets 302 from contaminating other components of the EUV exposure machine.

The droplet collector 340 can include a bowl-like structure or a frame-like structure provided outside the collector and surrounding the collector. When the droplet(s) 302 fly out through a gap between one reflective mirror 301 and another reflective mirror 301, the droplet collector 340 can capture the droplet(s) 302, thus preventing the droplets 302 from contaminating other components of the EUV exposure machine.

According to various embodiments, reflective mirrors can be configured to be movable and rotatable along a predetermined axis when accommodating an EUV light. Thus, the reflective mirrors can avoid droplets, to prevent reflective surface of the reflective mirrors from being contaminated by the droplets. As a result, maintenance cost of the EUV exposure machine can be reduced.

Further, the reflective mirrors can be movable and rotatable along a predetermined axis, and thus can be configured to be in a reflective state or a non-reflective state. When the reflective mirrors are configured to be in the reflective state, the plurality of reflective mirrors can be configured to converge EUV lights. When the reflective mirrors are configured to be in the non-reflective state, the reflective surfaces of the reflective mirrors can be rotated to (e.g., parallel to) flight directions of the droplets, such that contamination of the reflective surface(s) of the reflective mirrors by the droplets can be reduced to a minimum.

Furthermore, the reflective mirrors can be in the reflective state or the non-reflective state corresponding to the pulse mode of the incident laser beam. The time or the time length of the reflective mirrors being in the reflective state or the non-reflective state can be set based on parameters including a pulse duration time of the incident laser beam, an incident time of the incident laser beam, a speed of the incident laser beam, a speed of the EUV light, designed size of components of the EUV light source system, type of the EUV light excitation source material, and/or size of the droplets.

In addition, the time length of the reflective mirrors being in the reflective state can be greater than the pulse duration time of the incident laser beam and less than the time length for the droplets to start arriving at the reflective mirrors. The time length for the droplets to start arriving at the reflective mirrors can refer to a time length between a starting time of the pulse duration time of the incident laser beam and a time when the droplets start to arrive at the reflective mirrors.

The time length of the reflective mirrors being in the non-reflective state can be greater than the time length when the droplets can contaminate the reflective mirrors. Thus, the contamination by the droplets can be further reduced.

Figure 5:
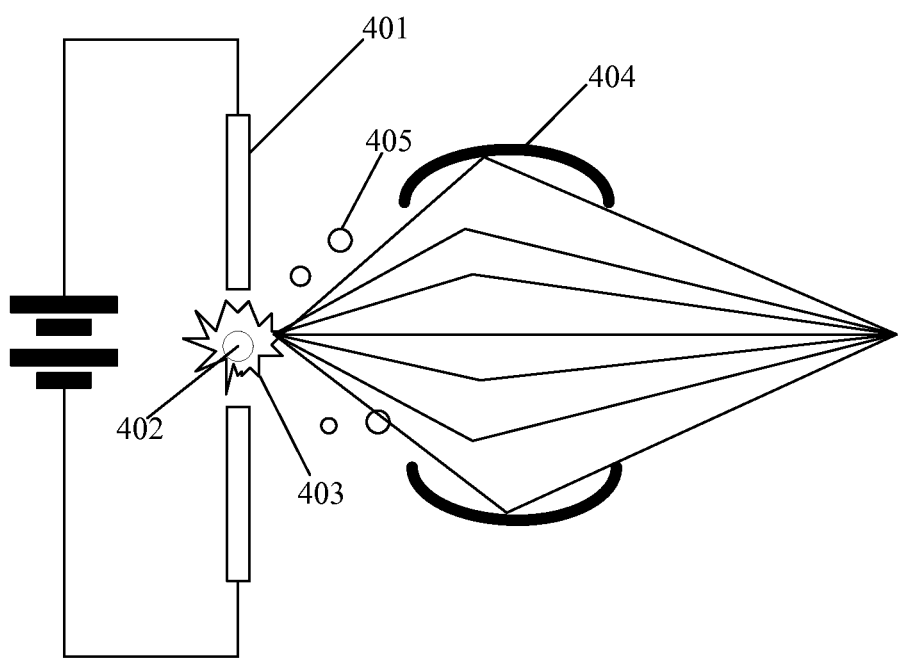
FIG. 5 depicts a system for EUV lithography light source that applies pulsed high-voltage charge to an EUV light excitation source material to generate an EUV light.

FIG. 5 depicts a system for EUV lithography light source that applies pulsed high-voltage charge to an EUV light excitation source material to generate an EUV light. For example, a process of applying a high voltage to an EUV light excitation source material to generate an EUV light (i.e., a discharging-plasma mode) can include high-voltage charging the EUV light excitation source material to generate a plasma. The plasma can thus radiate an EUV light.

In various embodiments, when a high voltage is applied to an EUV light excitation source material, the EUV light excitation source material can be charged, a plasma can be generated by a discharge process triggered by the charging. The charging and discharging process can be substantially simultaneous. Thus, as used herein, a mechanism of exciting an EUV light excitation source material to generate a plasma using a high-voltage charge can be interchangeably referred to as high-voltage charge or high-voltage discharge.

Referring to FIG. 5, in one embodiment, a system for EUV lithography light source can include an EUV light excitation source material 402. The EUV light excitation source material can include, e.g., Xe, Sn, and/or Li. The system can further include a high-voltage-discharge apparatus 401. The high-voltage-discharge apparatus 401 can be configured to apply a pulsed high voltage to charge the EUV light excitation source material 402, to generate a plasma 403. The plasma 403 can radiate an EUV light. The system can further include a collector 404 provided at a periphery of the EUV light excitation source material 402. The collector 404 can be configured to focus the EUV light.

As previously described, the excitation of the EUV light excitation source material can usually be incomplete. After the EUV light excitation source material is excited, droplets 405 can be produced. The droplets 405 can be incident on a surface of the collector 404 or surface of other optical devices in the EUV exposure machine, and thus can reduce reflectivity of the surface of the collector 404 or adhere to the surface of the collector 404 to cause contamination.

It is found that there can be a time delay between excitation of the EUV light excitation source material 402 and contamination of the surface of the collector 404 by the droplets 405. Because speed of light is about $10^8$ m/s, while the droplets 405 can have a speed ranging from about 1 m/sec to about 5 m/sec, the speed of the droplets 405 can be much lower than the speed of light. In addition, there can be a preset distance between the EUV light excitation source material 402 and the collector 404. When an EUV light reaches the surface of the collector 404, the droplets 405 have yet not contaminated the collector 404. That is, the droplets 405 can reach the collector 404 after a delay time T2 from starting of the high-voltage charging.

Figure 6A:
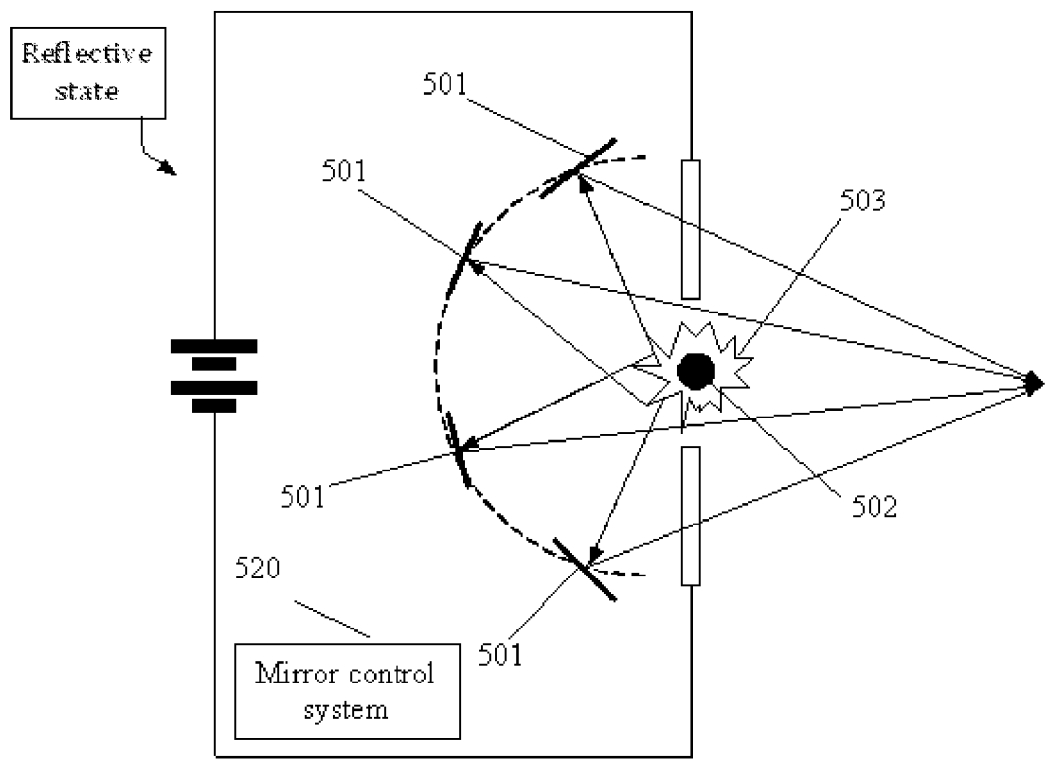
FIG. 6A depicts a structure diagram of another exemplary system for EUV lithography light source in a reflective state in accordance with various disclosed embodiments.
Figure 6B:
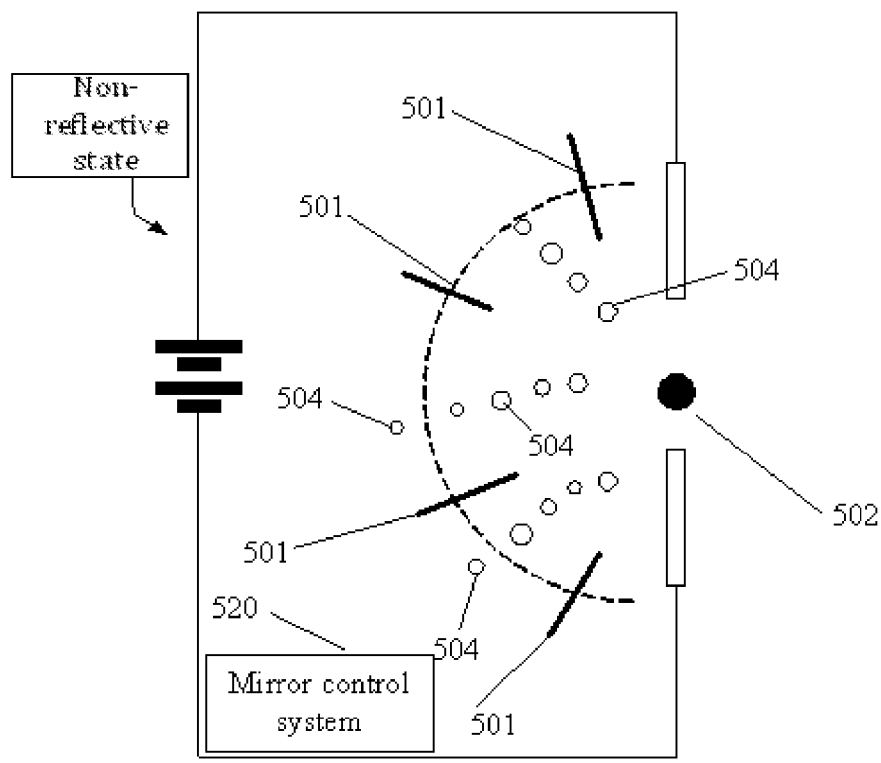
FIG. 6B depicts a structure diagram of another exemplary system for EUV lithography light source in a non-reflective state in accordance with various disclosed embodiments.

Therefore, various embodiments provide a system for EUV lithography light source. FIG. 6A depicts a structure diagram of another exemplary system for EUV lithography light source in a reflective state in accordance with various disclosed embodiments. FIG. 6B depicts a structure diagram of another exemplary system for EUV lithography light source in a non-reflective state in accordance with various disclosed embodiments.

The system for EUV lithography light source can have a collector for accommodating EUV light. The collector can include a plurality of reflective mirrors 501. The reflective mirrors 501 can be movable when accommodating the EUV light, and can be configured to be in a reflective state or in a non-reflective state. The reflective mirrors 501 can be movable under the control of a mirror control system 520 synchronized with an EUV generation apparatus, e.g., a high-voltage-discharge apparatus.

In various embodiments, the plurality of reflective mirrors 501 can be arranged around an EUV light excitation source material 502. The collector formed by the plurality of reflective mirrors 501 can collect and focus the EUV light to a central focal point or to a virtual source point.

In various embodiments, the number of the reflective mirrors 501 can be about 2, 3, 4 ... 7 ... 10 ..., i.e., any number greater than or equal to 2. A greater number of the movable reflective mirrors 501 can result in a better effect of avoiding contamination from droplets 504. However, a greater number of the reflective mirrors 501 can lead to increased cost, increased difficulty of controlling reflection, and reduced efficiency of the reflection. The number of the reflective mirrors 501 can be selected according to needs of actual EUV exposure, and is not limited in the present disclosure.

The reflective mirrors 501 can be made of a material including molybdenum, molybdenum alloy, silicon, ruthenium, and/or ruthenium alloy. Alternatively, the reflective mirrors 501 can have a silicon substrate and the silicon substrate can have a surface coated (e.g., plated) with a multi-layer structure including, e.g., silicon molybdenum film, molybdenum alloy, ruthenium and/or ruthenium alloy film.

In various embodiments, the reflective mirrors 501 can be configured to be in a reflective state or in a non-reflective state. The reflective state can be suitable for reflecting an EUV light. The non-reflective state can be suitable for avoiding contamination by the droplets 504.

For example, an EUV generation apparatus can be a pulsed high-voltage-discharge apparatus to generate an EUV light by exciting the EUV light excitation source 502 using high-voltage discharging. The high voltage can be applied in a pulse mode. The EUV generation apparatus can be independent of the system for EUV lithography light source or can be provided in the system for EUV lithography light source. The pulsed high-voltage-discharge apparatus can includes a pulsed high voltage generator, or a continuous high voltage generator followed by a pulse modulator.

For illustrative purposes, in this case, the high voltage can have a pulse duration time ranging from about 1 nanosecond to about 1 millisecond. The time of configuring the reflective mirrors 501 to be in the non-reflective state can lag behind the pulse duration time of the high voltage by a delay time T2. That is, a starting time of the reflective mirrors 501 being in the non-reflective state can lag behind a starting time of the pulse duration time of the high voltage by a delay time T2. The delay time T2 can range from about 2 milliseconds to about 12 milliseconds. In various embodiments, 'a starting time of the reflective mirrors 501 being in the non-reflective state' can refer to a starting time from which the reflective mirrors 501 start to be in the non-reflective state.

The delay time T2 is a certain time length that can correspond to the pulse mode of the high voltage, and can be constrained by parameters including, e.g., the pulse duration time of the high voltage, an application time of the high voltage, a speed of the EUV light, designed size of components of the EUV light source system, type of the EUV light excitation source material, and/or size of the droplets.

Still referring to FIG. 6A, FIG. 6A depicts the reflective mirrors 501 configured to be in a reflective state. For example, the EUV light excitation source material 502 can be charged by a pulsed high voltage. When the high voltage is applied to the EUV light excitation source material 502, the EUV light excitation source material 502 can generate a plasma 503 under the high voltage. The plasma 503 can then radiate an EUV light. At the same time, the plurality of reflective mirrors 501 have reflective surface(s) facing right at the EUV light, to form a reflective state, e.g., to form a curved reflective surface, to converge the EUV light to a focal point.

FIG. 6B depicts the reflective mirrors 501 configured to be in a non-reflective state. When the application of the high voltage on the EUV light excitation source material 502 stops, the reflective mirrors 301 can be configured to be in the non-reflective state. In one embodiment, the reflective surface (s) of the reflective mirrors 501 can be rotated to (e.g., parallel to) flight direction(s) of the droplets 504, such that contamination by the droplets 504 can be avoided.

In another embodiment, in order to better avoid the contamination by the droplets 504, the reflective mirrors 501 can be in the reflective state or the non-reflective state corresponding to the pulse mode of the high voltage. When the high voltage is in the pulse mode, a time length of the reflective mirrors 501 configured to be in the non-reflective state can lag behind a pulse duration time of the high voltage. That is, a starting time of the reflective mirrors 501 being in the non-reflective state can lag behind a starting time of the pulse duration time of the incident laser beam by a delay time T2, in order for the reflective surface of the reflective mirrors 501 to avoid facing flight direction(s) of the droplets 504.

There can be a time delay between excitation of the EUV light excitation source material 502 and contamination of the surface of the reflective mirrors 501 by the droplets 504. Because the speed of light is about $10^8$ m/s, while the droplets 504 can have a speed ranging from about 1 m/sec to about 5 m/sec, the speed of the droplets 504 can be much lower than the speed of light. In addition, there can be a preset distance between the EUV light excitation source material 502 and the collector. For example, a chamber size of the collector can range from about 10 cm to about 30 cm. According to the above data, it can take a time ranging from about 20 milliseconds to about 60 milliseconds for the droplets 504 to arrive at the reflective mirrors 501.

Figure 7:
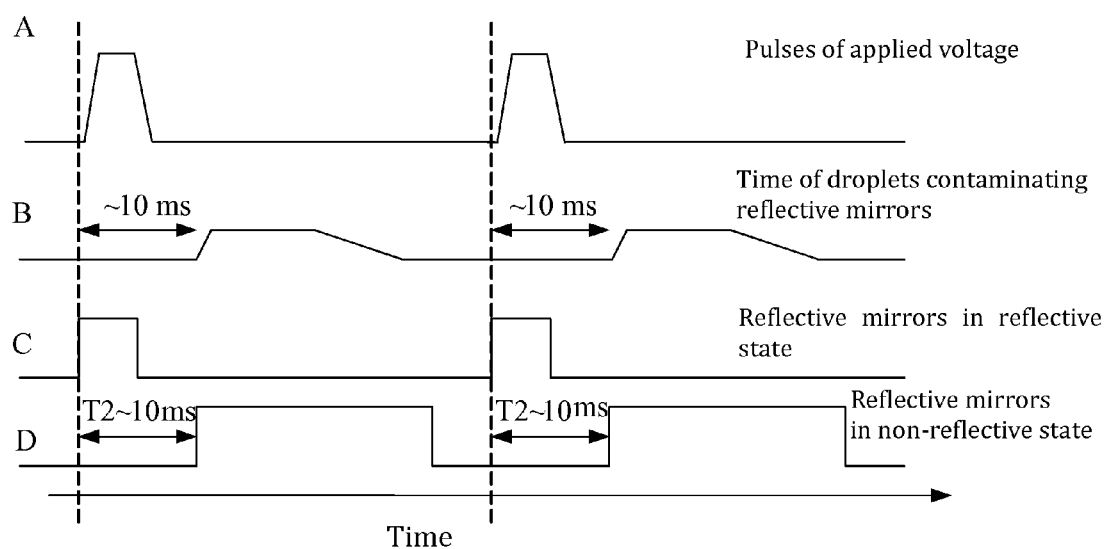
FIG. 7 depicts the time sequences of the DPP system signals, including pulses of a high voltage, contaminating droplet arrivals, a reflective mirror being in a reflective state, and a reflective mirror being in a non-reflective state, as a function of time in accordance with various disclosed embodiments.

According to the above data, FIG. 7 depicts the time sequences of the DPP system signals, including pulses of a high voltage, contaminating droplet arrivals, a reflective mirror being in a reflective state, and a reflective mirror being in a non-reflective state, as a function of time in accordance with various disclosed embodiments. Waveform A corresponds to pulses of an incident laser beam, waveform B corresponds to droplet contamination, waveform C corresponds to a reflective mirror being in a reflective state, and waveform D corresponds to a reflective mirror being in a non-reflective state. For illustrative purposes, in this case, the high voltage can have a pulse duration time less than about 10 milliseconds, and it can take a time of about 10 milliseconds for the droplets 504 to arrive at the reflective mirrors 501.

Waveform A as shown in FIG. 7 depicts a pulse frequency of a high voltage. The incident laser beam can have a pulse duration time less than about 10 milliseconds. Correspondingly, waveform B as shown in FIG. 7 depicts a time length when the droplets 504 can contaminate the reflective mirrors 501. For example, the time length when the droplets 504 can contaminate the reflective mirrors 501 can start at about 10 milliseconds after starting to apply the high voltage (i.e., start of the pulse of the high voltage), i.e., at the time when the droplets 504 can arrive at the reflective mirrors 501.

Therefore, correspondingly, waveform C as shown in FIG. 7 depicts the reflective mirrors 501 being in the reflective state as a function of time. Because the reflective mirrors 501 need to accommodate the EUV light, the time length of the reflective mirrors 501 being in the reflective state can be greater than the pulse duration time of the high voltage and less than the time length that the droplets 504 take to start arriving at the reflective mirrors 501. The time length that the droplets 504 take to start arriving at the reflective mirrors 501 can refer to a time length between a starting time of the pulse duration time of the high voltage and a time when the droplets 504 start to arrive at the reflective mirrors 501.

Correspondingly, waveform D as shown in FIG. 7 depicts the reflective mirrors 501 being in the non-reflective state as a function of time. The reflective mirrors 501 need to be in the non-reflective state when the droplets 504 may contaminate the reflective mirrors 501. Therefore, the time length of the reflective mirrors 501 being in the non-reflective state can be greater than the time length during which the droplets 504 can contaminate the reflective mirrors 501. Then the reflective mirrors 501 can enter the reflective state during the next pulse of the high voltage.

In one embodiment, the high voltage can be in a pulse mode, and can have a pulse duration time ranging from about 1 nanosecond to about 1 millisecond. The starting time of configuring the reflective mirrors 501 to be in the non-reflective state can lag behind the pulse duration time of the incident laser beam (i.e., lag behind starting of the pulse) by a time length (e.g., T2) ranging from about 2 milliseconds to about 12 milliseconds (e.g., about 10 milliseconds as depicted by waveform D in FIG. 7).

In various embodiments, the plurality of reflective mirrors can be moved into the non-reflective state at the delay time T2 after a starting time of each high voltage pulse cycle of the high-voltage discharge. The delay time T2 can be shorter than or substantially equal to a flight time of the droplets to fly from the source material to reach a surface of a reflective mirror of the plurality of reflective mirrors.

The time or the time length of the reflective mirrors 501 being in the reflective state or the non-reflective state needs to be set based on parameters including a pulse duration time of the high voltage, an application time of the high voltage, a speed of the EUV light, designed size of components of the EUV light source system, type of the EUV light excitation source material, and/or size of the droplets. In various embodiments, an additional control apparatus can be provided to control switching of the reflective mirrors 501 between the reflective state and the non-reflective state, via electric control, magnetic control, and/or mechanical control.

Figure 8:
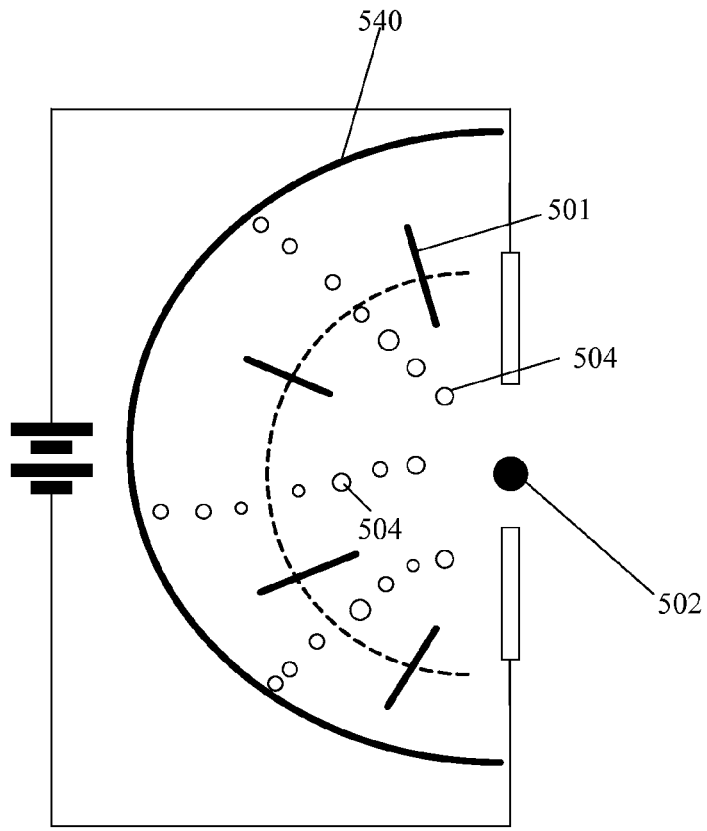
FIG. 8 depicts a structure diagram of another exemplary system for EUV lithography light source including an outer droplet stopper in accordance with various disclosed embodiments.

FIG. 8 depicts a structure diagram of another exemplary system for EUV lithography light source in accordance with various disclosed embodiments. In one embodiment, the system may further include a droplet collector 540 provided on an outer periphery of the collector. The droplet collector 540 can be configured to capture the droplets 504 that fly out of or away from the EUV light excitation source material 502, to prevent the droplets 504 from contaminating other components of the EUV exposure machine.

The droplet collector 540 can include, e.g., a bowl-like structure or a frame-like structure provided outside the collector and surrounding the collector. When the droplet(s) 504 fly out through a gap between one reflective mirror 501 and another reflective mirror 501, the droplet collector 540 can capture the droplets 504, thus preventing the droplets 504 from contaminating other components of the EUV exposure machine.

According to various embodiments, reflective mirrors can be configured to be movable and rotatable along a predetermined axis, and thus can be configured to be in a reflective state or a non-reflective state when accommodating an EUV light. Thus, when the reflective mirrors converge EUV light (s) during normal operation, the reflective mirrors can avoid droplets, to prevent reflective surface of the reflective mirrors from being contaminated by the droplets. As a result, maintenance cost of the EUV exposure machine can be reduced.

Further, the reflective mirrors can be configured to be in a reflective state or a non-reflective state. When the reflective mirrors are configured to be in the reflective state, the plurality of reflective mirrors can be configured to converge EUV light. When the reflective mirrors are configured to be in the non-reflective state, the reflective surface(s) of the reflective mirrors can be rotated to (e.g., parallel to) flight direction of the droplets, such that contamination of the reflective surfaces of the reflective mirrors by the droplets can be reduced to a minimum.

Furthermore, the reflective mirrors can be in the reflective state or the non-reflective state corresponding to the pulse mode of the high voltage. The time or the time length of the reflective mirrors being in the reflective state or the non-reflective state can be set based on parameters including a pulse duration time of the high voltage, an application time of the high voltage, a speed of the EUV light, designed size of components of the EUV light source system, type of the EUV light excitation source material, and/or size of the droplets.

In addition, the time length of the reflective mirrors being in the reflective state can be greater than the pulse duration time of the high voltage and less than the time length the droplets take to start arriving at the reflective mirrors. The time length of the reflective mirrors being in the non-reflective state can be greater than the time length during which the droplets can contaminate the reflective mirrors, in order to further reduce the contamination by the droplets.

Various embodiments also provide a method for EUV lithography light source operation. The method can include the following exemplary steps. An EUV light can be generated using a system for EUV lithography light source. During generation of the EUV light (e.g., by laser radiation or high-voltage charging), an EUV light excitation source material can generate droplets that fly out of the EUV light excitation source material. When the EUV light excitation source material is excited to generate the EUV light, reflective mirrors of the system can be configured to be in a reflective state. The reflective state can be suitable for reflecting the EUV light. After the EUV light excitation source material is excited to generate the EUV light, the reflective mirrors of the system for EUV lithography light source can be configured to be in a non-reflective state. The non-reflective state can be suitable for avoiding contamination by the droplets.

The system for EUV lithography light source can be a system for EUV lithography light source as described in various disclosed embodiments (e.g., in FIGS. 2A-2B, FIG. 4, FIGS. 6A-6B, or FIG. 8). The reflective state can be suitable for reflecting the EUV light. The non-reflective state can be suitable for avoiding contamination by the droplets.

When the reflective mirrors are configured to be in the reflective state, the plurality of reflective mirrors can converge the UV light. When the reflective mirrors are configured to be in the non-reflective state, the reflective mirrors can be rotated such that reflective surface(s) of the reflective mirrors can be aligned with (e.g., parallel to) flight direction of the droplets, or such that non-reflective surface(s) of the reflective mirrors can face toward flight direction of the droplets. That is, the reflective mirrors are switched to positions having the least contact surface with the droplets. Further details can be similar to or the same as described in various disclosed embodiments (e.g., in FIGS. 2A-2B, FIG. 4, FIGS. 6A-6B, or FIG. 8).

In one embodiment, when an EUV generation apparatus generates an EUV light by exciting the EUV light excitation source material using a laser-plasma mode, the laser can be in a pulse mode. The time length of the reflective mirrors being in the non-reflective state can lag behind a pulse duration time of the incident laser beam, in order to avoid facing flight direction of the droplets.

In another embodiment, when an EUV generation apparatus generate an EUV light by exciting the EUV light excitation source material using high-voltage discharging (i.e., using a discharging-plasma mode), the high-voltage discharging can be in a pulse mode. The time length of the reflective mirrors being in the non-reflective state can lag behind a pulse duration time of the high voltage, in order to avoid facing flight direction(s) of the droplets.

According to various embodiments, when an EUV light excitation source material is excited to generate an EUV light, reflective mirrors of a system for EUV lithography light source can be configured to be in a reflective state. After the EUV light excitation source material is excited to generate the EUV light, the reflective mirrors of the system can be configured to be in a non-reflective state, such that the reflective mirrors can avoid droplets, and prevent reflective surface of the reflective mirrors from being contaminated by the droplets. As a result, maintenance cost of the EUV exposure machine can be reduced.

As further disclosed in various embodiments, an apparatus for decontaminating light source used in EUV Lithography is also provided. The apparatus can include an EUV light excitation source material (also referred to as an EUV generating material) provided in the middle of a collector (the collector is also referred to as a light collection system). The collector can include a plurality of movable mirrors. The mirrors can have high reflection coating for EUV lights.

In one embodiment, the apparatus can include one or more pulsed laser systems emitting pulsed light to excite EUV photons from the EUV light excitation source material. In another embodiment, the apparatus can include a pulsed high-voltage discharge system exciting EUV photons from the EUV light excitation source material.

Further, the apparatus can include a mirror control system synchronized with the laser systems or the pulsed high-voltage discharge system. Thus, the mirrors can be set to reflect the EUV light to a predetermined orientation (i.e., in a reflective state) when the EUV light is emitted, and the mirrors can be set to deflect (i.e., in a non-reflective state) to avoid droplets from the EUV light excitation source material.

A starting time of the reflective mirrors being in the non-reflective state can lag behind a starting time of the pulse duration time of the incident laser beam or the high-voltage discharge by a time length ranging from about 2 milliseconds to about 12 milliseconds, e.g., of about 10 milliseconds. That is, the starting time of the reflective mirrors being in the non-reflective state can be substantially the same as the time when the droplets can start to arrive at the reflective mirrors, e.g., about 10 milliseconds after starting time of the incident laser beam or the high-voltage discharge.

Figure 9:
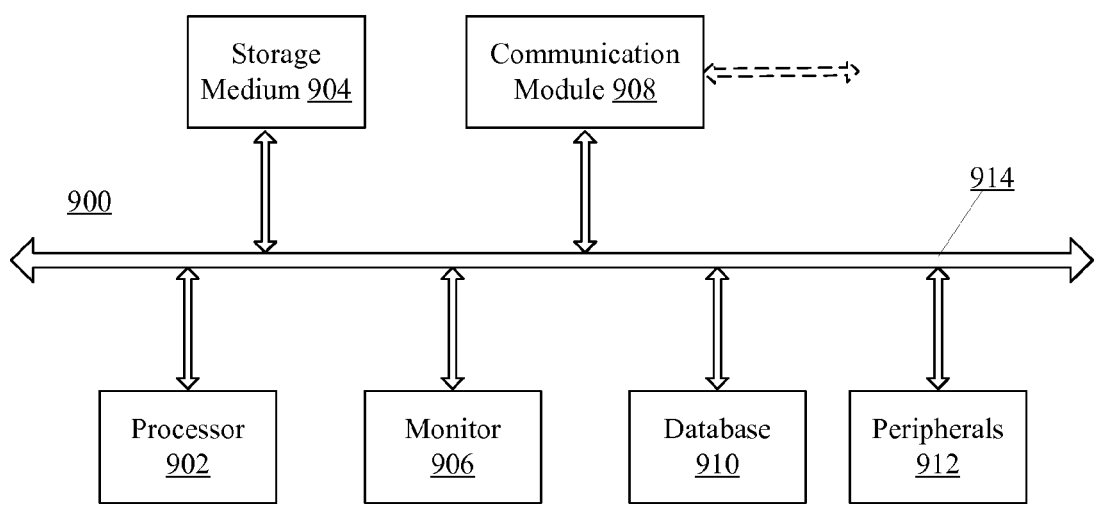
FIG. 9 depicts an exemplary computer-based mirror control system consistent with the disclosed embodiments.

The mirror control system can be implemented on any appropriate computer system. For example, FIG. 9 depicts an exemplary computer-based mirror control system consistent with the disclosed embodiments. As shown in FIG. 9, the exemplary computer system 900 may include a processor 902, a storage medium 904, a monitor 906, a communication module 908, a database 910, peripherals 912, and one or more bus 914 to couple the devices together. Certain devices may be omitted and other devices may be included.

The processor 902 can include any appropriate processor or processors. Further, the processor 902 can include multiple cores for multi-thread or parallel processing. The storage medium 904 may include memory modules, e.g., Read-Only Memory (ROM), Random Access Memory (RAM), and flash memory modules, and mass storages, e.g., CD-ROM, U-disk, removable hard disk, etc. The storage medium 904 may store computer programs for implementing various processes (e.g., synchronizing moving of reflective mirrors with the laser systems or the pulsed high-voltage discharge system, to properly configure direction of the reflective mirrors), when executed by the processor 902.

The monitor 906 may include display devices for displaying contents in the computing system 900. The peripherals 912 may include I/O devices such as keyboard and mouse.

Further, the communication module 908 may include network devices for establishing connections with other computer systems or devices via a communication network. The database 910 may include one or more databases for storing certain data and for performing certain operations on the stored data, e.g., storing data of pulse generation by laser systems or the pulsed high-voltage discharge system, etc.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A system for extreme ultraviolet (EUV) lithography light source, comprising:
    a pulsed laser radiation apparatus configured to provide laser radiation;
    an EUV light excitation source material configured to receive the laser radiation to generate an EUV light, wherein the laser radiation generates droplets from the EUV light excitation source material;
    a collector configured to collect the EUV light, comprising: a plurality of reflective mirrors surrounding the EUV light excitation source material, wherein the plurality of reflective mirrors are movable; and
    a mirror control system synchronized with the pulsed laser radiation apparatus and configured to set the plurality of reflective mirrors to be simultaneously in a reflective state for reflecting the EUV light and configured to set the plurality of reflective mirrors to be simultaneously in a non-reflective state by rotating the plurality of reflective mirrors to be substantially parallel to a corresponding flight direction of droplets for preventing contamination by the droplets.

2. The system according to claim 1, wherein the laser radiation comprises a pulse laser, or a continuous laser modulated into pulsed radiation.

3. The system according to claim 1, wherein: the plurality of reflective mirrors are moved into the non-reflective state at a delay time T after a starting time of each laser pulse cycle of the laser radiation, wherein the delay time T is shorter than the flight time of the droplets to fly from the source material to reach the surface of a reflective mirror of the plurality of reflective mirrors.

4. The system according to claim 3, wherein the delay time T ranges from about 2 milliseconds to about 12 milliseconds.

5. The system according to claim 1, wherein the EUV light excitation source material includes Xe, Sn, Li, or a combination thereof.

6. The system according to claim 1, wherein the reflective surface of the plurality of reflective mirrors each comprises: a material including molybdenum, molybdenum alloy, silicon, ruthenium, a ruthenium alloy, or a combination thereof; or a multi-layer structure including a silicon molybdenum film, a molybdenum alloy, ruthenium, a ruthenium alloy film, or a combination thereof.

7. The system according to claim 1, further including: a droplet collector provided on an outer periphery of the collector.

8. A system for EUV lithography light source, comprising:
a pulsed high-voltage-discharge apparatus configured to apply a high-voltage discharge;
an EUV light excitation source material configured to receive the high-voltage discharge to generate an EUV light, wherein the high-voltage discharge generates droplets from the EUV light excitation source material;
a collector configured to collect the EUV light, comprising:
a plurality of reflective mirrors surrounding the EUV light excitation source material, wherein the plurality of reflective mirrors are movable; and
a mirror control system synchronized with the pulsed high-voltage-discharge apparatus and configured to set the plurality of reflective mirrors to be simultaneously in a reflective state for reflecting the EUV light and configured to set the plurality of reflective mirrors to be simultaneously in a non-reflective state by rotating the plurality of reflective mirrors to be substantially parallel to a corresponding flight direction of droplets for preventing contamination by the droplets.

9. The system according to claim 8, wherein the pulsed high-voltage-discharge apparatus comprises a pulsed high voltage generator, or a continuous high voltage generator followed by a pulse modulator.

10. The system according to claim 8, wherein:
when the plurality of reflective mirrors are in the reflective state, the plurality of reflective mirrors are configured to converge the EUV light; and
when the plurality of reflective mirrors are in the non-reflective state, the plurality of reflective mirrors are rotated to be substantially parallel to a corresponding flight direction of the droplets.

11. The system according to claim 8, wherein:
the plurality of reflective mirrors are moved into the non-reflective state at a delay time T2 after a starting time of each high voltage pulse cycle of the high-voltage discharge, wherein the delay time T2 is shorter than the flight time of the droplets to fly from the source material to reach the surface of a reflective mirror of the plurality of reflective mirrors.

12. The system according to claim 11, wherein:
the high-voltage discharge is in a pulse mode having a pulse duration time ranging from about 1 nanosecond to about 1 millisecond; and
the delay time T2 ranges from about 2 milliseconds to about 12 milliseconds.

13. The system according to claim 8, wherein the EUV light excitation source material includes Xe, Sn, Li, or a combination thereof.

14. The system according to claim 8, wherein the reflective surface of the plurality of reflective mirrors each comprises:
a material including molybdenum, molybdenum alloy, silicon, ruthenium, a ruthenium alloy, or a combination thereof; or
a multi-layer structure including a silicon molybdenum film, a molybdenum alloy, ruthenium, a ruthenium alloy film, or a combination thereof.

15. The system according to claim 8, further comprising:
a droplet collector provided on an outer periphery of the collector.

\* \* \* \* \*